United States Patent [19]
Jones et al.

[11] Patent Number: 6,018,354
[45] Date of Patent: Jan. 25, 2000

[54] METHOD FOR ACCESSING BANKS OF DRAM

[75] Inventors: Anthony Mark Jones; Donald William Walker Paterson, both of Bristol, United Kingdom

[73] Assignee: Discovision Associates, Irvine, Calif.

[21] Appl. No.: 08/474,231

[22] Filed: Jun. 7, 1995

Related U.S. Application Data

[62] Division of application No. 08/400,058, Mar. 7, 1995, abandoned.

[51] Int. Cl.[7] ................................................. G06F 13/16
[52] U.S. Cl. .............................. 345/521; 345/508; 711/5; 711/157
[58] Field of Search ................................ 711/5, 157, 154, 711/105; 345/521, 508, 511

[56] References Cited

U.S. PATENT DOCUMENTS

| | | | |
|---|---|---|---|
| 3,893,042 | 7/1975 | Whitman et al. | 331/55 |
| 3,962,685 | 6/1976 | Belle Isle | 340/172.5 |
| 4,107,780 | 8/1978 | Grimsdale et al. | 364/521 |
| 4,135,242 | 1/1979 | Ward et al. | 364/200 |
| 4,142,205 | 2/1979 | Iinuma | 358/13 |
| 4,149,242 | 4/1979 | Pirz | 364/200 |
| 4,196,448 | 4/1980 | Whitehouse et al. | 358/135 |
| 4,215,369 | 7/1980 | Lijima | 358/146 |
| 4,236,228 | 11/1980 | Nagashima et al. | 365/114 |
| 4,302,775 | 11/1981 | Widergren et al. | 358/136 |
| 4,334,246 | 6/1982 | Saran | 358/261 |
| 4,433,308 | 2/1984 | Hirata | 331/17 |
| 4,437,072 | 3/1984 | Asami | 331/1 A |
| 4,442,503 | 4/1984 | Schutt et al. | 364/900 |
| 4,495,629 | 1/1985 | Zasio et al. | 377/70 |

(List continued on next page.)

FOREIGN PATENT DOCUMENTS

| | | | |
|---|---|---|---|
| 0075893 | 4/1983 | European Pat. Off. | G06F 13/00 |
| 0196911 | 10/1986 | European Pat. Off. | |
| 0255767 | 2/1988 | European Pat. Off. | |
| 0321628 | 6/1989 | European Pat. Off. | G06F 13/42 |
| 0468480 | 1/1992 | European Pat. Off. | |

(List continued on next page.)

OTHER PUBLICATIONS

Chong, "A Data Flow Architecture For Digital Image Processing," WesconTech. Papers No. 4/6, Oct. 30, 1984, Anaheim, California, USA, pp. 1–10.

P. Yip, et al., "DIT and DIF Algorithm for Discrete Sine and Cosine Transforms" Proceedings of the International Symposium on Circuits and Systems, IEEE Press, New York, US, vol. 2/3, Jun. 1985, Kyoto, JP, pp. 941–944.

(List continued on next page.)

*Primary Examiner*—Kee M. Tung
*Attorney, Agent, or Firm*—Robert T. Braun; Donald Bollella; Clay E. Gaetje

[57] ABSTRACT

This invention discloses a method for accessing Dynamic Random Access Memory (DRAM) to store and retrieve data words associated with a two dimensional image. The DRAM includes two separate banks, a first bank and a second bank. Each bank is capable of operating in page mode to read and write the data words. The two dimensional image is organized in a two dimensional grid pattern of cells, each cell containing an M by N matrix of pixels. The words associated with each cell occupy one page or less of a bank. Each cell is assigned a particular one of the two banks so that all data words associated with that particular cell are read from and written to one particular page of that particular bank. The assignment of banks to cells is done such that each cell is associated with a different bank than any bordering cell which is also either in the same row or in the same column. There is then read the data words associated with a cell that is composed of a matrix of pixels and is not aligned with the two dimensional grid pattern, but is aligned with pixels in cells in the two dimensional grid pattern.

8 Claims, 6 Drawing Sheets

U.S. PATENT DOCUMENTS

| | | | |
|---|---|---|---|
| 4,540,903 | 9/1985 | Cooke et al. | 307/465 |
| 4,580,066 | 4/1986 | Berndt | 307/276 |
| 4,598,372 | 7/1986 | McRoberts | 364/518 |
| 4,630,198 | 12/1986 | Iyuan | 364/200 |
| 4,646,151 | 2/1987 | Welles, II et al. | 358/149 |
| 4,679,163 | 7/1987 | Arnould et al. | 364/725 |
| 4,689,823 | 8/1987 | Wojcik et al. | 382/41 |
| 4,747,070 | 5/1988 | Trottier et al. | 364/900 |
| 4,785,349 | 11/1988 | Keith et al. | 358/136 |
| 4,789,927 | 12/1988 | Hannah | 364/200 |
| 4,799,056 | 1/1989 | Hattori et al. | 340/799 |
| 4,799,677 | 1/1989 | Frederiksen | 273/1 E |
| 4,807,028 | 2/1989 | Hatori et al. | 358/133 |
| 4,823,201 | 4/1989 | Simon et al. | 358/133 |
| 4,829,465 | 5/1989 | Knauer et al. | 364/725 |
| 4,831,440 | 5/1989 | Borgers et al. | 358/133 |
| 4,866,510 | 9/1989 | Goodfellow et al. | 358/13 |
| 4,866,637 | 9/1989 | Gonzalez-Lopez et al. | 364/518 |
| 4,885,786 | 12/1989 | Anderson et al. | 382/47 |
| 4,887,224 | 12/1989 | Okano et al. | 364/518 |
| 4,891,784 | 1/1990 | Kato et al. | 364/900 |
| 4,903,018 | 2/1990 | Wiebach et al. | 341/51 |
| 4,912,668 | 3/1990 | Aubie et al. | 364/725 |
| 4,922,341 | 5/1990 | Strobach | 358/136 |
| 4,924,298 | 5/1990 | Kitamura | 358/12 |
| 4,924,308 | 5/1990 | Feuchtwanger | 358/133 |
| 4,975,595 | 12/1990 | Roberts et al. | 307/272.2 |
| 4,991,112 | 2/1991 | Callemyn | 364/518 |
| 5,003,204 | 3/1991 | Cushing et al. | 307/465 |
| 5,010,401 | 4/1991 | Murakami et al. | 358/136 |
| 5,027,212 | 6/1991 | Marlton et al. | 358/183 |
| 5,038,209 | 8/1991 | Hang | 358/136 |
| 5,053,985 | 10/1991 | Friedlander et al. | 364/725 |
| 5,057,793 | 10/1991 | Cowley et al. | 331/1 A |
| 5,060,242 | 10/1991 | Arbeiter | 375/122 |
| 5,081,450 | 1/1992 | Lucas et al. | 340/728 |
| 5,086,489 | 2/1992 | Shimura | 382/56 |
| 5,091,721 | 2/1992 | Hamori | 340/727 |
| 5,107,345 | 4/1992 | Lee | 358/432 |
| 5,111,292 | 5/1992 | Kuriacose et al. | 358/133 |
| 5,113,255 | 5/1992 | Nagata et al. | 358/136 |
| 5,122,873 | 6/1992 | Golin | 358/133 |
| 5,122,875 | 6/1992 | Raychaudhuri et al. | 358/133 |
| 5,124,790 | 6/1992 | Nakayama | 358/133 |
| 5,126,842 | 6/1992 | Andrews et al. | 358/133 |
| 5,129,059 | 7/1992 | Hannah | 395/166 |
| 5,130,568 | 7/1992 | Miller et al. | 307/272.2 |
| 5,134,487 | 7/1992 | Taguchi et al. | 358/209 |
| 5,134,697 | 7/1992 | Scheffler | 395/425 |
| 5,136,371 | 8/1992 | Savatier et al. | 358/133 |
| 5,136,695 | 8/1992 | Goldshlag et al. | 395/275 |
| 5,142,380 | 8/1992 | Sakagami et al. | 358/432 |
| 5,146,325 | 9/1992 | Ng | 358/135 |
| 5,146,326 | 9/1992 | Hasegawa | 358/135 |
| 5,148,271 | 9/1992 | Kato et al. | 358/133 |
| 5,148,524 | 9/1992 | Harlin et al. | 395/166 |
| 5,151,875 | 9/1992 | Sato | 364/784 |
| 5,151,997 | 9/1992 | Bailey et al. | 395/800 |
| 5,159,449 | 10/1992 | Allmendinger | 358/136 |
| 5,164,819 | 11/1992 | Music | 358/13 |
| 5,168,356 | 12/1992 | Acampora et al. | 358/133 |
| 5,168,375 | 12/1992 | Reisch et al. | 358/432 |
| 5,172,011 | 12/1992 | Leuthold et al. | 307/272.2 |
| 5,174,641 | 12/1992 | Lim | 358/141 |
| 5,175,617 | 12/1992 | Wallace et al. | 358/133 |
| 5,179,372 | 1/1993 | West et al. | 340/799 |
| 5,182,642 | 1/1993 | Gersdorff et al. | 358/133 |
| 5,184,124 | 2/1993 | Molpus et al. | 341/50 |
| 5,185,819 | 2/1993 | Ng et al. | 382/56 |
| 5,189,526 | 2/1993 | Sasson | 358/432 |
| 5,191,548 | 3/1993 | Balkanski et al. | 364/725 |
| 5,193,002 | 3/1993 | Guichard et al. | 358/133 |
| 5,201,056 | 4/1993 | Daniel et al. | 395/800 |
| 5,202,847 | 4/1993 | Bolton et al. | 364/725 |
| 5,212,549 | 5/1993 | Ng et al. | 358/135 |
| 5,212,742 | 5/1993 | Normile et al. | 382/56 |
| 5,214,507 | 5/1993 | Aravind et al. | 358/133 |
| 5,216,724 | 6/1993 | Suzuki et al. | 382/7 |
| 5,221,966 | 6/1993 | Clayton et al. | 358/140 |
| 5,223,926 | 6/1993 | Stone et al. | 358/133 |
| 5,227,878 | 7/1993 | Puri et al. | 358/136 |
| 5,228,098 | 7/1993 | Crinon et al. | 382/56 |
| 5,229,863 | 7/1993 | Kao et al. | 358/426 |
| 5,231,484 | 7/1993 | Gonzales et al. | 358/133 |
| 5,231,486 | 7/1993 | Acampora et al. | 358/133 |
| 5,233,420 | 8/1993 | Piri et al. | 358/149 |
| 5,233,690 | 8/1993 | Sherlock et al. | 395/165 |
| 5,237,413 | 8/1993 | Israelsen et al. | 358/160 |
| 5,237,432 | 8/1993 | Calarco et al. | 358/451 |
| 5,241,222 | 8/1993 | Small et al. | 307/449 |
| 5,241,383 | 8/1993 | Chen et al. | 358/136 |
| 5,241,658 | 8/1993 | Masterson et al. | 395/162 |
| 5,247,612 | 9/1993 | Quinard | 395/166 |
| 5,249,146 | 9/1993 | Uramoto et al. | 364/725 |
| 5,253,058 | 10/1993 | Gharavi | 358/136 |
| 5,253,078 | 10/1993 | Balkanski et al. | 358/426 |
| 5,257,213 | 10/1993 | Kim et al. | 364/725 |
| 5,257,223 | 10/1993 | Dervisoglu | 365/154 |
| 5,257,350 | 10/1993 | Howard et al. | 395/162 |
| 5,258,725 | 11/1993 | Kinoshita | 331/17 |
| 5,260,781 | 11/1993 | Soloff et al. | 358/133 |
| 5,260,782 | 11/1993 | Hui | 358/133 |
| 5,261,047 | 11/1993 | Rivshin | 395/163 |
| 5,263,136 | 11/1993 | DeAguiar et al. | 395/164 |
| 5,267,334 | 11/1993 | Normille et al. | 382/56 |
| 5,276,513 | 1/1994 | van der Wal et al. | 358/136 |
| 5,276,681 | 1/1994 | Tobagi et al. | 370/85.4 |
| 5,276,784 | 1/1994 | Ohki | 395/127 |
| 5,278,520 | 1/1994 | Parker et al. | 331/1 A |
| 5,278,646 | 1/1994 | Civanlar et al. | 358/133 |
| 5,278,647 | 1/1994 | Hingorani et al. | 358/136 |
| 5,283,646 | 2/1994 | Bruder | 348/415 |
| 5,287,178 | 2/1994 | Acampora et al. | 348/384 |
| 5,287,193 | 2/1994 | Lin | 358/261.1 |
| 5,287,420 | 2/1994 | Barrett | 382/56 |
| 5,287,470 | 2/1994 | Simpson | 395/425 |
| 5,289,276 | 2/1994 | Siracusa et al. | 348/467 |
| 5,289,577 | 2/1994 | Gonzales et al. | 395/163 |
| 5,293,229 | 3/1994 | Iu | 348/415 |
| 5,294,894 | 3/1994 | Gebara | 331/1 A |
| 5,297,271 | 3/1994 | Bhayani | 395/425 |
| 5,298,896 | 3/1994 | Lei et al. | 341/51 |
| 5,298,992 | 3/1994 | Pietras et al. | 348/415 |
| 5,299,025 | 3/1994 | Shirasawa | 358/400 |
| 5,300,949 | 4/1994 | Rodriguez et al. | 345/202 |
| 5,301,019 | 4/1994 | Citta | 348/416 |
| 5,301,032 | 4/1994 | Hong et al. | 358/261.2 |
| 5,301,040 | 4/1994 | Hoshi et al. | 358/465 |
| 5,301,136 | 4/1994 | McMillan, Jr. et al. | 364/725 |
| 5,301,242 | 4/1994 | Gonzales et al. | 382/56 |
| 5,301,272 | 4/1994 | Atkins | 395/165 |
| 5,303,342 | 4/1994 | Edge | 395/164 |
| 5,304,953 | 4/1994 | Heim et al. | 331/1 A |
| 5,305,438 | 4/1994 | MacKay et al. | 395/164 |
| 5,307,180 | 4/1994 | Williams et al. | 358/448 |
| 5,307,449 | 4/1994 | Kelley et al. | 395/119 |
| 5,309,527 | 5/1994 | Ohki | 382/56 |
| 5,311,309 | 5/1994 | Ersoz et al. | 348/409 |
| 5,319,460 | 6/1994 | Kubo | 348/715 |
| 5,321,806 | 6/1994 | Meinerth et al. | 395/162 |
| 5,343,218 | 8/1994 | Maeda | 345/508 |
| 5,351,047 | 9/1994 | Behlen | 341/67 |

| | | | |
|---|---|---|---|
| 5,384,745 | 1/1995 | Konishi et al. | 365/230.03 |
| 5,390,029 | 2/1995 | Williams et al. | 358/448 |
| 5,392,071 | 2/1995 | Richards et al. | 348/398 |
| 5,430,488 | 7/1995 | Hedley | 348/446 |
| 5,446,866 | 8/1995 | Drako et al. | 395/500 |
| 5,448,310 | 9/1995 | Kopet et al. | 348/719 |
| 5,457,780 | 10/1995 | Shaw et al. | 395/165 |
| 5,461,679 | 10/1995 | Normile et al. | 395/650 |
| 5,486,876 | 1/1996 | Lew et al. | 348/719 |
| 5,488,432 | 1/1996 | Guillon et al. | 348/717 |
| 5,495,291 | 2/1996 | Adams | 348/390 |
| 5,502,494 | 3/1996 | Auld | 348/426 |
| 5,502,573 | 3/1996 | Fujinami | 358/339 |
| 5,517,462 | 5/1996 | Iwamoto et al. | 365/233 |
| 5,517,603 | 5/1996 | Kelley et al. | 395/126 |
| 5,553,005 | 9/1996 | Voeten et al. | 364/514 |
| 5,561,777 | 10/1996 | Kao et al. | 711/5 |
| 5,568,165 | 10/1996 | Kimura | 345/185 |
| 5,572,691 | 11/1996 | Koudmani | 3995/405 |
| 5,577,203 | 11/1996 | Reinert et al. | 345/200 |
| 5,703,793 | 12/1997 | Wise et al. | 364/514 |

FOREIGN PATENT DOCUMENTS

| | | | |
|---|---|---|---|
| 0572262 | 12/1993 | European Pat. Off. . | |
| 0572263 | 12/1993 | European Pat. Off. . | |
| 0576749 | 1/1994 | European Pat. Off. . | |
| 0589734 | 3/1994 | European Pat. Off. . | |
| 0639032 | 2/1995 | European Pat. Off. . | |
| 61-080940 | 4/1986 | Japan | H04M 9/00 |
| 61-80940 | 4/1986 | Japan | H04M 9/00 |
| 2039106 | 7/1980 | United Kingdom | G06F 13/00 |
| 2045035 | 10/1980 | United Kingdom . | |
| 2059724 | 4/1981 | United Kingdom . | |
| 2171578 | 8/1986 | United Kingdom . | |
| 2194085 | 2/1988 | United Kingdom . | |
| 2268035 | 12/1993 | United Kingdom . | |
| 2269070 | 1/1994 | United Kingdom . | |
| 9315586 | 8/1993 | WIPO | H04N 7/01 |

OTHER PUBLICATIONS

Hsieh S. Hou, "A Fast Recursive Algorithm for computing the Discrete Cosine Transform," IEEE Transactions on Acoustics, Speech, and Signal Processing, vol. 35, No. 10, Oct. 1987, IEEE Press, New York, US, pp. 1455–1461.

Komori et al., An Elastic Pipeline Mechanism By Self–Timed Circuits, IEEE Journal Of Solid–State Circuits, vol. 23, No. 1, 2/88, New York, NY, USA, pp. 111–117.

A. Gupta et al., "A Fast Recursive Algorithm for the Discrete Sine Transform," IEEE Transactions on Acoustics, Speech, and Signal Processing, vol. 38, No. 3, Mar. 1990, IEEE Press, New York, US, pp. 553–557.

H.R. Wu, et al., "A Two Dimensional Fast Cosine Transform Algorithm Based on Hou's Approach," IEEE Transaction on Acoustics, Speech, and Signal Processing, vol. 39, No. 2, Feb. 1991, IEEE Press, New York, US, pp. 544–546.

Foley, J.D. et al. "Breshman's Line Algorithm" Electrochemistry, Proceedings of the First Conference Held in Sydney Feb. 1963. J.A. Friend and F. Gutmann Jan. 1, 1982 pp. 433–436. XP000563829.

|   |   |   |   |   |   |   |   |
|---|---|---|---|---|---|---|---|
| 0 | 1 | 2 | 3 | 4 | 5 | 6 | 7 |
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |

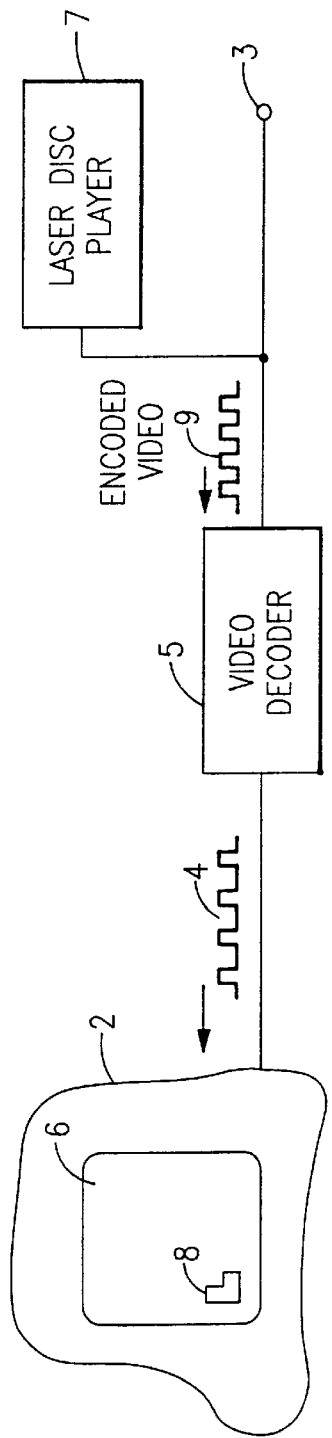
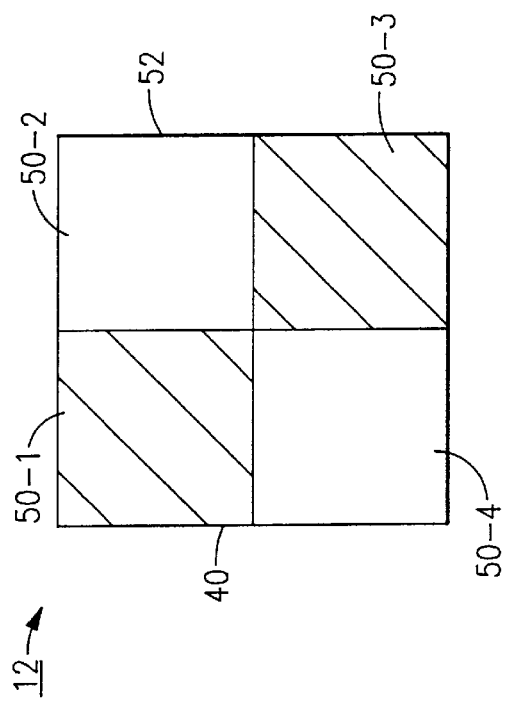

METHOD FOR ACCESSING BANKS OF DRAM

This is a division of application Ser. No. 08/400,058, filed Mar. 7, 1995 now abandoned.

REFERENCE TO RELATED APPLICATIONS

This application is related to British Patent Application entitled "Method for Accessing Banks of DRAM" as U.K. Serial No. 9415391.3 filed on Jul. 29, 1994 and British Patent Application entitled "Video Decompression" as U.K. Serial No. 9405914.4 filed on Mar. 24, 1994 and British Patent Application entitled "Method and Apparatus for Interfacing with RAM" as U.K. Serial No. 9503964.0 filed on Feb. 28, 1995.

BACKGROUND

This invention relates to Random Access Memory (RAM), and more particularly, to a method for accessing different banks of dynamic RAM. One of the most popular types of RAM is Dynamic Random Access Memory (DRAM). Much attention has been paid to methods for accessing (reading from or writing to) DRAMs. The main concern is speed of access. The dominant limitation on access speed is the need to precharge the RAM before starting an access.

Access speed is greatly increased by accessing more of the RAM using a single precharge, a technique called page mode addressing. In page mode addressing, a block of data words (two or more) has the same row address for each word. Accessing the block involves charging only the column addresses of the data words in the block, not the fixed row address, thus saving on the need to precharge before continuing the access.

Refreshing and precharging in a timely and efficient manner is accomplished by interleaving blocks of data into two separate banks of DRAMS. In this manner, while one DRAM bank is being accessed, the other bank could be safely refreshed or precharged, thereby eliminating (or at least reducing) dead time. Ideally, data would be accessed from the one bank in blocks long enough that refreshing or precharging of the other bank could be finished. In practice, however, this does not always occur because RAM memory systems typically lack a provision for selecting which particular bank to refresh.

These two methods can be combined, as disclosed in U.S. Pat. No. 5,274,788. This patent discloses a RAM memory system in which contiguous memory address locations are interleaved, on a single page basis, between two DRAM banks.

While the combined technique of '788 patent is generally adequate, it is most effective when handling access to a linear sequence of data blocks that are read out of DRAM in essentially the same order as they were written into the DRAM (e.g., cache memory systems). In some applications, however, data blocks are actually related to each other in two (or more) dimensions (e.g., digital video). There is therefore a need for a memory system that interleaves between banks in a manner that takes into account the multi-dimensional relationship between the data blocks.

SUMMARY OF THE INVENTION

This invention discloses a method for accessing Dynamic Random Access Memory (DRAM) to store and retrieve data words associated with a two dimensional image. The DRAM includes two separate banks, a first bank and a second bank. Each bank is capable of operating in page mode to read and write the data words. The two dimensional image is organized in a two dimensional grid pattern of cells, each cell containing an M by N matrix of pixels. The words associated with each cell occupy one page or less of a bank. Each cell is assigned a particular one of the two banks so that all data words associated with that particular cell are read from and written to one particular page of that particular bank. The assignment of banks to cells is done such that each cell is associated with a different bank than any bordering cell which is also either in the same row or in the same column. There is then read the data words associated with a cell that is composed of a matrix of pixels, and that is not aligned with the two dimensional grid pattern, but that is aligned with pixels in cells in the two dimensional grid pattern.

In accordance with another aspect of the invention, the data words associated with the unaligned cell are read by first reading, from the first bank of DRAM, the data words associated with one of the cells in the grid pattern identified as containing data words associated with the unaligned cell. Then there are read, from the second bank of DRAM, the data words associated with another of the cells in the grid pattern containing data words associated with the unaligned cell. Alternate readings between the first and second banks are continued until all the data words associated with the unaligned cell have been read.

In accordance with another aspect of the invention, the data words associated with the unaligned cell are read by first reading, in a predetermined order of cells, the data words associated with each cell in the grid pattern containing data words associated with the unaligned cell. The predetermined order of cells is chosen such that data words read from succeeding cells are read from alternating banks.

In accordance with another aspect of the invention, the predetermined order is a clockwise rotation of cells in the grid pattern identified as containing data words associated with the unaligned cell. Alternately, the predetermined order is a counterclockwise rotation of cells in the grid pattern identified as containing data words associated with the unaligned cell.

BRIEF DESCRIPTION OF THE DRAWINGS

FIG. 7 is a pictorial representation of a video decoder that includes the RAM system of FIG. 6, and provides digital video to the screen of FIG. 1.

FIG. 8 depicts a cell of FIGS. 1 or 4 being further partitioned into subcells, and the relationship between subcells and the RAM banks of FIG. 6.

DETAILED DESCRIPTION OF THE PREFERRED EMBODIMENT

Figure 1:
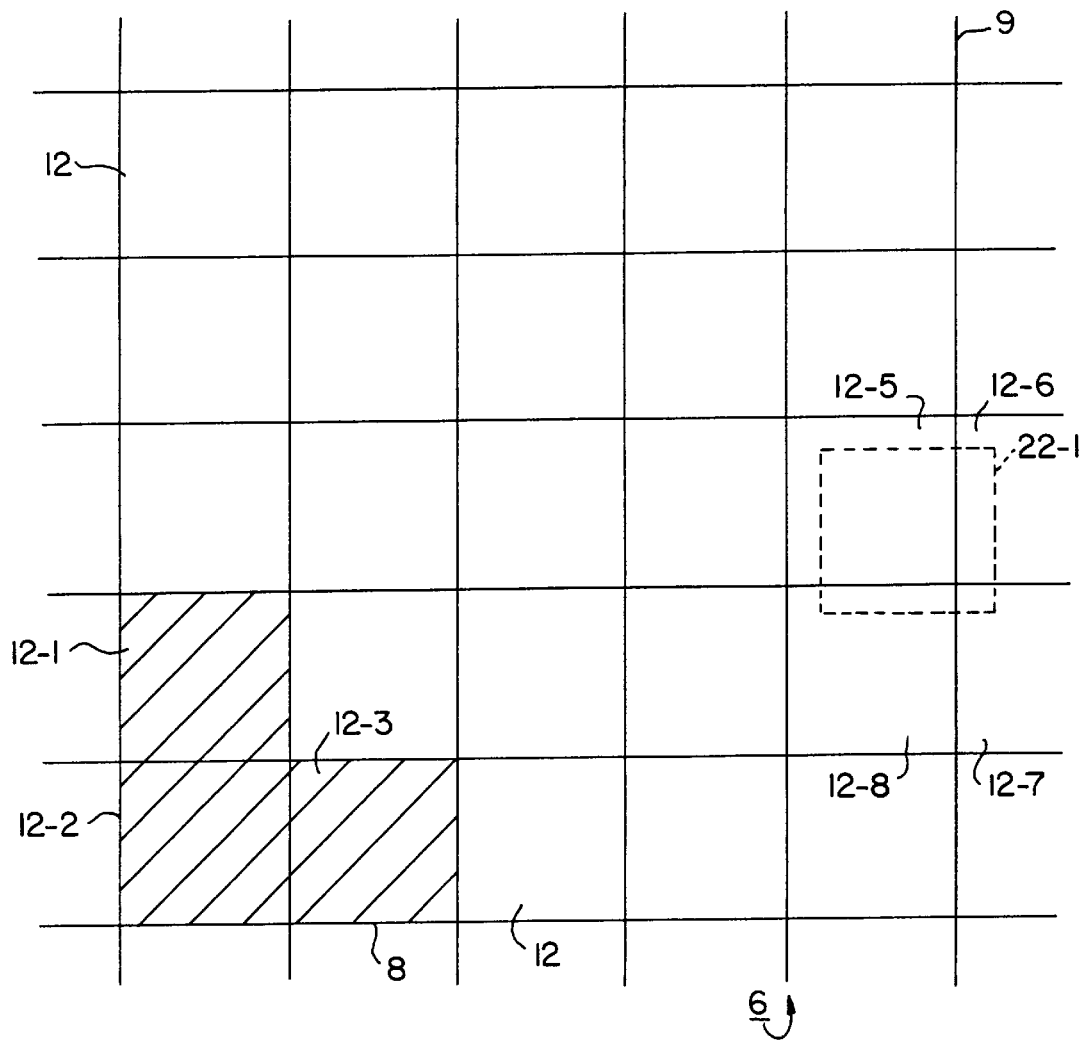
FIG. 1 depicts an image, displayed on a television or monitor screen, composed of cells that are aligned in a rectangular grid, and one unaligned cell superimposed over the aligned cells.
Figures 2, 3:
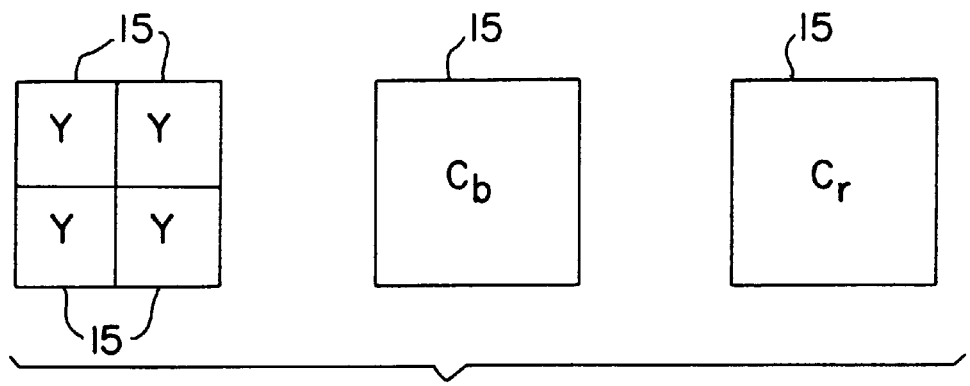
FIG. 2 depicts the arrangement of pixels within each cell of FIG. 1, each cell being an exemplary eight pixel by eight pixel block.
FIG. 3 depicts data words representing each pixel of FIG. 2.

Referring now to FIGS. 1, 2, and 7, FIG. 7 shows a video monitor 2 having a display screen 6 suitable for displaying images 8 rendered from digital video 4. The source of digital video 4 is video decoder 5. Video decoder 5 includes suitable decoding circuitry (not shown). Video decoder 5 decodes encoded video 9. Typical sources of encoded video 9 include CD or laser disc player 7, or cable television hook-up 3. In FIG. 1 there is shown a portion of a display screen 6, including image 8. Images such as image 8 are composed of pixels 14 (FIG.2). Typically pixels 14 are grouped into cells 12. By grouping pixels 14 into cells 12, the digital video 4 representing image 8 (as well as the rest of display screen 6) can be manipulated (e.g., compressed) more efficiently.

While cells 12 could be arranged in any repeating pattern, typically cells 12 are arranged in the pattern of a rectilinear grid 9. The pattern of grid 9 extends across display screen 6. Within each cell 12, pixels 14 typically are arranged in a square matrix of N rows by N columns. For example, in FIG. 2 cell 12 consists of eight row by eight columns of pixels 14. Associated with each pixel 14 is an identifying position number 13 (from 0 to 63). Alternately, pixels 14 could be grouped in a non-square matrix (i.e., M rows by N columns, where M does not equal N).

Referring now to FIGS. 1, 2, and 3, digital video 4 includes a number of data words 15. In the MPEG digital video standard, six data words 15 are required to represent each region of four pixels 14: One word 15 represents Cb, one word 15 represents Cr, and four words 15 represent Y (luminance).

Figure 6:
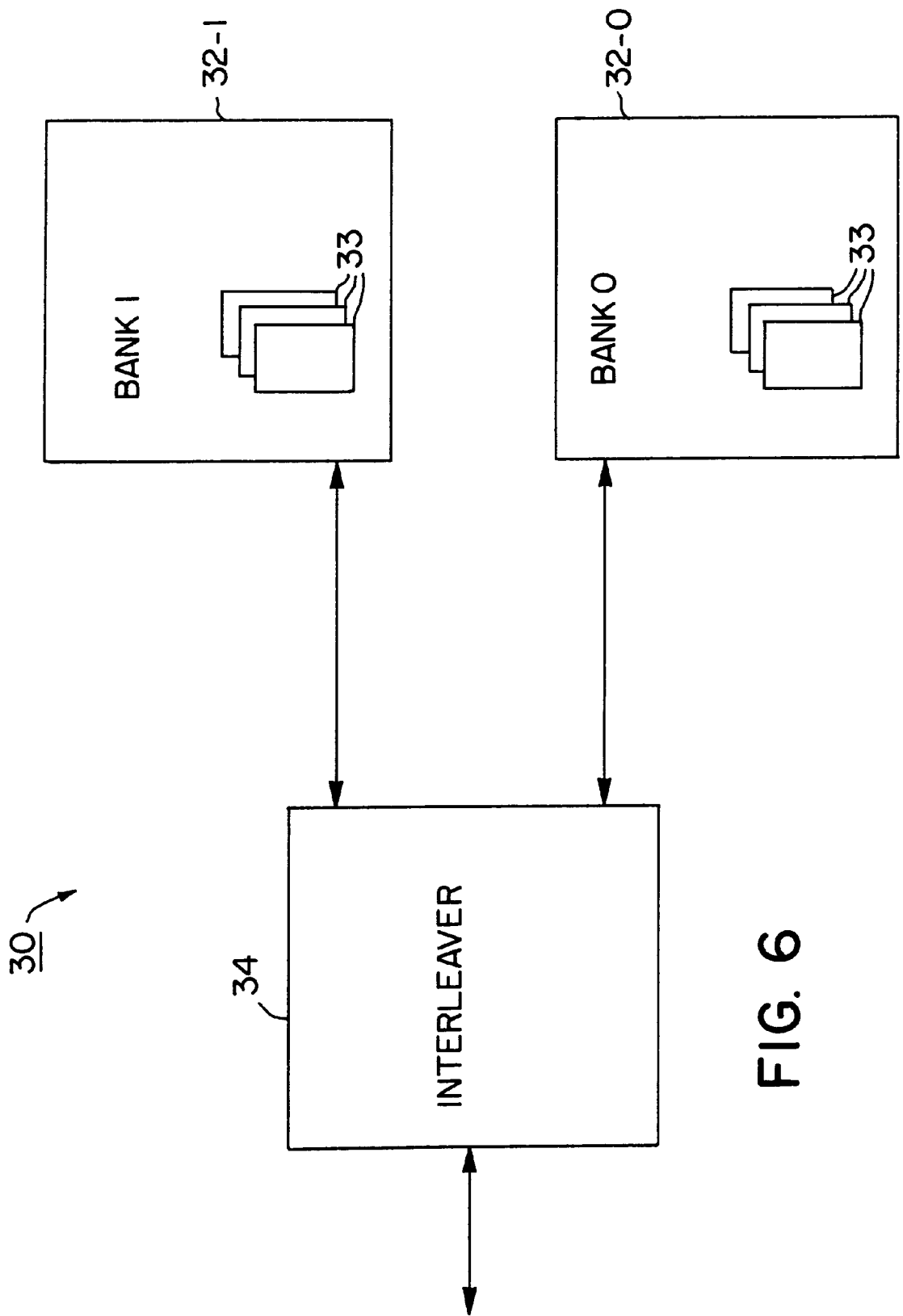
FIG. 6 is a block diagram of a RAM system having two banks of RAM and used to store data words of FIG. 3.

Referring now to FIGS. 1, 3, 6 and 7, video decoder 5 includes RAM system 30. RAM system 30 is the memory video decoder 5 uses to store data words 15. Video decoder 5 reads words 15 from RAM system 30 in the course of creating, displaying, and manipulating image 8 on screen 6. RAM system 30 includes interleaver 34 and two banks 32 of RAM, bank0 32-0 and bank1 32-1. Interleaver 34 connects banks 32 to the portion (not shown) of video decoder 5 that is used to create, display, and manipulate images 8. In banks 32, data words 15 are stored in pages 33, which are represented in FIG. 6 as overlapping rectangles. A typical size for a page 33 is 1024 eight bit words.

Figure 4:
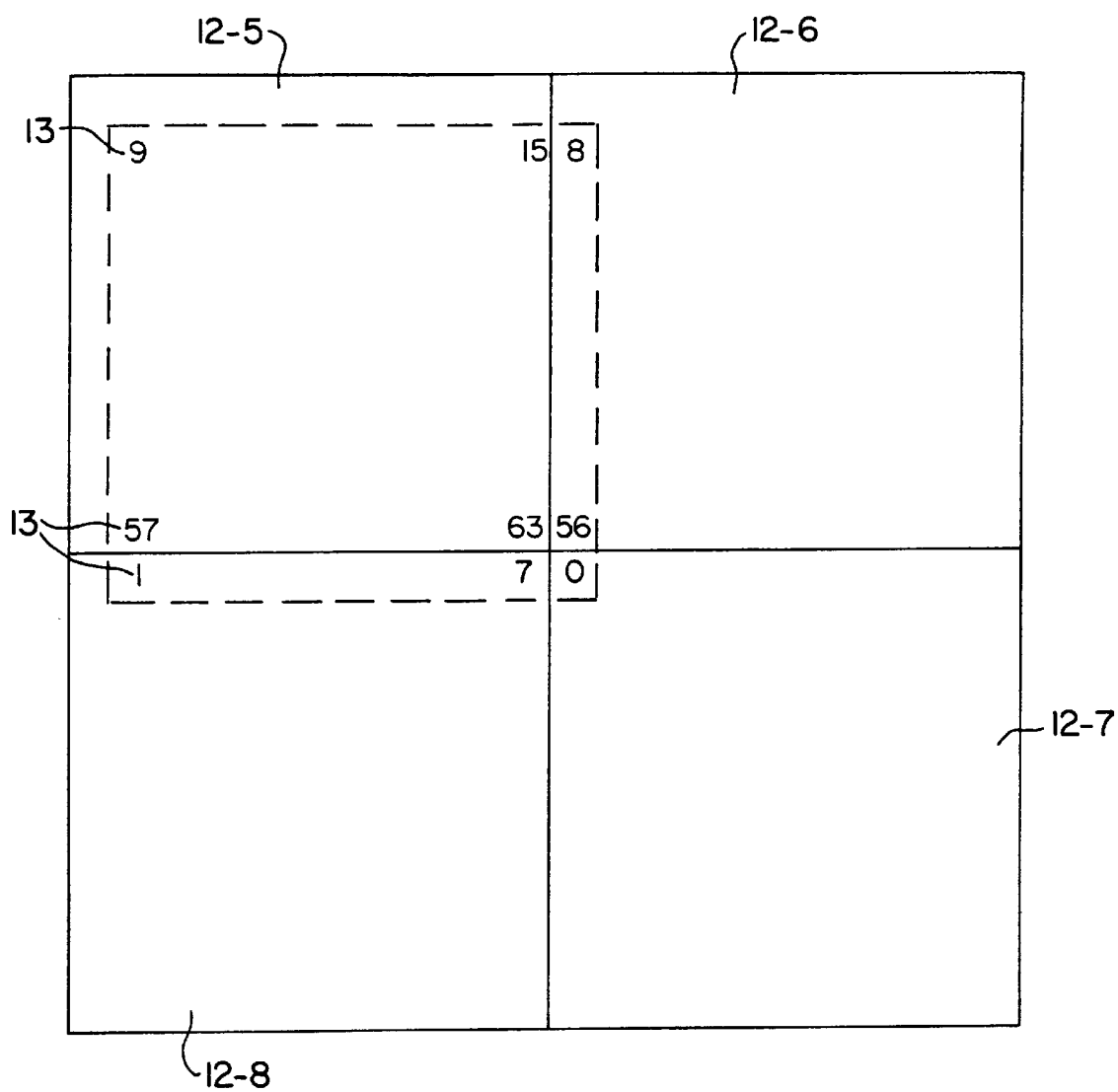
FIG. 4 depicts the relationship between an unaligned cell and the pixels in underlying aligned cells.

Referring now to FIGS. 1, 2 and 4, one requirement of video decoder 5 is the ability to read a cell 22 that is not aligned to the existing cell grid 9. Instead, cell 22 is aligned to pixels 14 within cells 12. This ability to read unaligned cells 22 is required for searching image 8 for features, or for detecting motion between successive images 8.

Referring now to FIGS. 1 and 4, in FIG. 1 there is shown a cell 22-1 to be read from RAM system 30. Cell 22-1 is not aligned with grid 9, but is aligned to the pixels 14 of cells 12. Cell 22-1 is shown in dotted lines, and can be seen to overlap four cells 12, 12-5, 12-6, 12-7, and 12-8.

In FIG. 4 there is shown a more detailed representation of how unaligned read cell 22-1 overlaps underlying cells 12-5, 12-6, 12-7 and 12-8. The numbers within cell 22-1 represent the numbers 13 of the pixels 14 at the boundary between cell 22-1 and each underlying cell 12. Note that unaligned read cell 22-1 largely consists of pixels 14 drawn from a single underlying cell 12-5. The number of pixels 14 drawn from cells 12-6, 12-8, and 12-7 are seven, seven and one, respectively. Forty-nine pixels are drawn from cell 12-5.

In FIGS. 1 and 4, rectilinear grid 9 is shown without showing how pages 33 containing the data words 15 representing each cell 12 are interleaved. Conceivably the respective pages 33 associated with all of the cells 12 underneath a particular unaligned read cell 22 could be in the same bank 32 of RAM system 30. If so, creating the unaligned read cell 22 would, in the worst case, involve accessing four pages 33 from the same bank 32, a process that requires dead time to precharge that bank 32 three times. For all unaligned cells 22 on image 8, the worst case must appear: Searching or matching do not specify where unaligned cell 22 is, and hence can always be the worst case.

Much better than accessing four pages 33 from the same bank 32 is to access two pages 33 from each bank 32, a process that maximizes interleaving possibilities. The question now becomes how to deal with cases like the example of FIG. 4, in which most of the pixels 14 of the unaligned read cell 22-1 are drawn from a single underlying cell 12-5, leaving little time to precharge while performing the relatively short reads needed to read data from the pages 33 associated with the other three underlying cells 12-6, 12-7 and 12-8. Another difficult case has the unaligned read cell 22 overlying substantial portions of two cells 12, and insubstantial portions of another two cells 12.

In accordance with the invention, the problem of relatively short read times is reduced by interleaving in a particular two-dimensional pattern 40 the pages 33 associated with cells 12.

Figure 5:
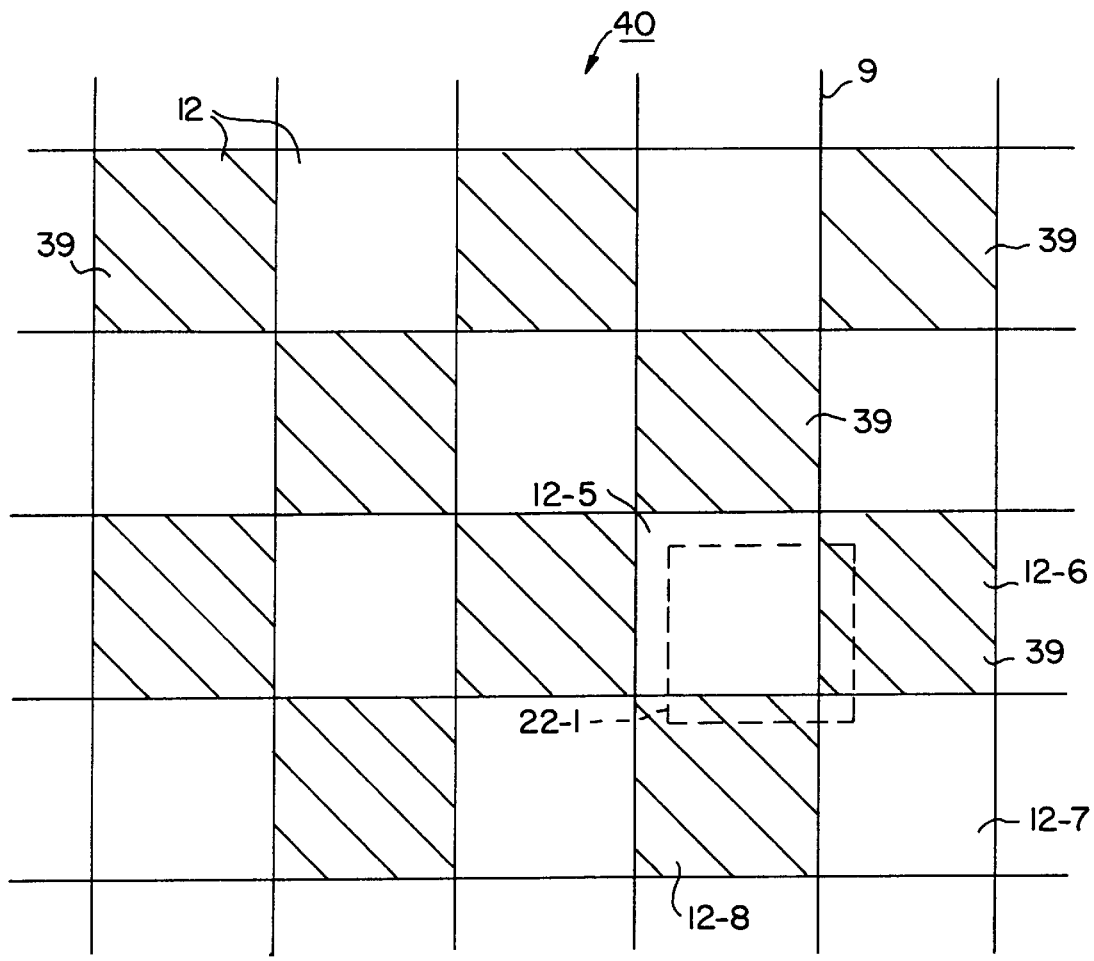
FIG. 5 is a pictorial diagram mapping the cells of FIGS. 1 or 4 onto the RAM banks of FIG. 6.

Referring now to FIGS. 5 and 6, in FIG. 5 half of the cells 12 are shown with hatching 39, and half of the cells 12 lack hatching 39. The presence of hatching 39 on a cell 12 signifies that the page 33 associated with that particular cell 12 resides in bank0 32-0. The absence of hatching 39 on a cell 12 signifies that the page 33 associated with that particular cell 12 resides in bank1 32-1. For example, cell 12-6 is shown hatched, so the page 33 associated with the data words 15 that describe cell 126 are stored in bank0 32-0, and so must be read from bank0 32-0.

In accordance with the invention, the problem of relatively short read times is reduced by having interleaver 34 interleave pages 33 into banks 32 based on a particular two dimensional pattern 40 of cells 12 associated with pages 33. As shown in FIG. 5, pattern 40 resembles a checkerboard: No two sequential cells 12 in the same row of grid 9 have their associated page 33 in the same bank 32, and no two sequential cells 12 in the same column of grid 9 have their associated page 33 in the same bank 32. Checkerboard pattern 40 maximizes interleave possibilities by ensuring that when unaligned read cell 22 overlies four cells 12, the pages 33 of two of the overlaid cells 12 are stored in one bank 32, while the pages 33 associated with the other two overlaid cells 12 are stored in the other bank 32. For example, in FIG. 5, cells 12-5 and 12-7 have their associated pages 33 stored in bank1 32-1, while cells 12-6 and 12-8 have their associated pages 33 stored in bank0 32-0.

For maximum interleave efficiency, pages 33 should be read from alternate banks 32. This is ensured by reading from the four cells 12 underlying an unaligned read cell 22 in either a clockwise order, or in a counter-clockwise order. As an example of the method of reading in the clockwise direction, consider the four cells 12 underlying cell 22-1 in FIG. 5. First, the page 33 associated with cell 12-5 would be read from bank1 32-1 by interleaver 34. Then the page 33 associated with cell 12-6 would be read, since cell 12-6 is positioned in the same row as cell 12-5, and to the right of cell 12-5. Next the page 33 associated with cell 12-7 would be read, since cell 12-7 is in the same column as cell 12-6, and below cell 12-6. Finally the page 33 associated with cell 12-8 would be read, since cell 12-8 is in the same row as cell 12-7, and to the left of cell 12-7.

Simulations have shown that the checkerboard pattern 40 of interleaving banks 32 reduces dead time. The aspect ratio and size of checkerboard pattern 40 can be selected to be optimum for the particular application. The only requirement is that at least one cell 12 underlying an unaligned read cell 22 is represented by less than one page 33 of words 15. In this manner, each of the four possible reads of underlying cells 12 is self-contained, limiting the interleaving to the mechanism described. Any further fragmentation would involve a more complex interleaving algorithm and would cause longer dead times.

Note that sometimes each pair of possible reads of underlying cells 12 contains words 15 in the same page 33 (e.g., words 15 from cells 12-6 and 12-8 underlying unaligned read cell 22-1 many be contained on the same page 33). Therefore the reading of words 15 from pages 33 could be further optimized. However, the worst case scenario remains.

The method of the present invention can also be applied, with out any loss in performance, to cells 12 having dimensions (M by N) that require more data words 15 than can be stored in a single page 33. Referring now to FIGS. 6 and 8, such a cell 12 is divided by subgrid 52 into subcells 50, with the dimensions of subcells 50 chosen so that the number of words 15 associated with each subcell 50 can be stored in a single page 33. As shown in FIG. 8, the same checkerboard pattern 40 can be applied to subcells 50 (e.g., subcells 50-1 and 50-3 stored in the same bank 32, and subcells 50-2 and 50-4 stored in the same bank 32), allowing the accessing of words 15 associated with each "oversized" cell 12 to be managed in the same efficient manner as cells 12 themselves are managed.

While the invention has been described with reference to the structures and methods disclosed, it is not confined to the specific details set forth, but is intended to cover such modifications or changes as may come within the scope of the following claims.

We claim:

1. A method for accessing Dynamic Random Access Memory (DRAM) to store and retrieve data words associated with a two dimensional image, the DRAM including two separate banks, each bank being capable of operating in page mode to read and write the data words, the two dimensional image being organized in a two dimensional grid pattern of cells, each cell containing an M by N matrix of pixels, and the words associated with each cell occupying one page or less of a bank, the method comprising the steps of:

(a) assigning each cell a particular one of the two banks so that all data words associated with that particular cell are read from and written to one particular page of that particular bank, the assignment of banks to cells being done such that each cell is associated with a different bank than any bordering cell which is also either in the same row or in the same column;

(b) reading the data words associated with a cell that is composed of an M by N matrix of pixels, and that is not aligned with the two dimensional grid pattern, but that is aligned with pixels in cells in the two dimensional grid pattern by the steps of (c) reading, from the first bank of DRAM, the data words associated with one of the cells in the grid pattern containing data words associated with the unaligned cell;

(d) immediately thereafter, reading, from the second bank of DRAM, the data words associated with another of the cells in the grid pattern containing data words associated with the unaligned cell;

(e) repeating steps (c) and (d) until all the data words associated with the unaligned cell have been read.

2. The method of claim 1, wherein the DRAM includes a first and a second bank, and the step (b) of reading the data words associated with the unaligned cell includes the steps of:

(d) reading, in a predetermined order of cells, the data words associated with each cell in the grid pattern containing data words associated with the unaligned cell, the predetermined order of cells resulting in data words read from succeeding cells being read from alternating banks.

3. The method of claim 2, wherein the predetermined order is a clockwise rotation of cells in the grid pattern containing data words associated with the unaligned cell.

4. The method of claim 2, wherein the predetermined order is a counter-clockwise rotation of cells in the grid pattern containing data words associated with the unaligned cell.

5. The method of claim 1, wherein the DRAM includes a first and a second bank, and the step (b) of reading the data words associated with the unaligned cell includes the steps of:

(c) identifying which cells in the two dimensional grid pattern contain data words associated with the unaligned cell;

(d) reading, from the first bank of DRAM, the data words associated with one of the cells in the grid pattern identified as containing data words associated with the unaligned cell;

(e) reading, from the second bank of DRAM, the data words associated with another of the cells in the grid pattern identified as containing data words associated with the unaligned cell;

(f) repeating steps (d) and (e) until all the data words associated with the unaligned cell have been read.

6. The method of claim 1, wherein the DRAM includes a first and a second bank, and the step (b) of reading the data words associated with the unaligned cell includes the steps of:

(c) identifying which cells in the two dimensional grid pattern contain data words associated with the unaligned cell;

(d) reading, in a predetermined order of cells, the data words associated with each cell in the grid pattern identified as containing data words associated with the unaligned cell, the predetermined order of cells resulting in data words read from succeeding cells being read from alternating banks.

7. The method of claim 6, wherein the predetermined order is a clockwise rotation of cells in the grid pattern identified as containing data words associated with the unaligned cell.

8. The method of claim 6, wherein the predetermined order is a counter-clockwise rotation of cells in the grid pattern identified as containing data words associated with the unaligned cell.

* * * * *

UNITED STATES PATENT AND TRADEMARK OFFICE
CERTIFICATE OF CORRECTION

PATENT NO. : 6,018,354
DATED : January 25, 2000
INVENTOR(S) : Anthony M. Jones et al.

Page 1 of 1

It is certified that error appears in the above-identified patent and that said Letters Patent is hereby corrected as shown below:

<u>Title page,</u>
Add under:

-- [30]       Foreign Application Priority Data
Mar. 24, 1994  [GB]   United Kingdom         9405914.4
Jul. 29, 1994  [GB]   United Kingdom         9415391.3
Feb. 28, 1995  [GB]   United Kingdom         9503964.0 --

Signed and Sealed this

Ninth Day of April, 2002

Attest:

Attesting Officer

JAMES E. ROGAN
Director of the United States Patent and Trademark Office